United States Patent
Peidous et al.

(10) Patent No.: US 7,893,496 B2
(45) Date of Patent: Feb. 22, 2011

(54) STRESS ENHANCED TRANSISTOR

(75) Inventors: Igor Peidous, Fishkill, NY (US); Rohit Pal, Fishkill, NY (US)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 12/644,882

(22) Filed: Dec. 22, 2009

(65) Prior Publication Data

US 2010/0096698 A1 Apr. 22, 2010

Related U.S. Application Data

(62) Division of application No. 11/611,784, filed on Dec. 15, 2006, now Pat. No. 7,704,840.

(51) Int. Cl.
*H01L 27/12* (2006.01)
(52) U.S. Cl. ........... 257/347; 257/E29.02; 257/E29.266
(58) Field of Classification Search ................. 257/347, 257/E29.02, E29.266
See application file for complete search history.

(56) References Cited

U.S. PATENT DOCUMENTS

| 6,348,385 | B1 | 2/2002 | Cha et al. | |
|---|---|---|---|---|
| 2005/0090066 | A1* | 4/2005 | Zhu et al. | 438/300 |
| 2005/0260801 | A1 | 11/2005 | Divakaruni et al. | |
| 2006/0214236 | A1 | 9/2006 | Chien | |
| 2006/0234455 | A1 | 10/2006 | Chen et al. | |
| 2008/0042215 | A1 | 2/2008 | Ieong et al. | |

FOREIGN PATENT DOCUMENTS

| EP | 1246258 A1 | 10/2002 |
|---|---|---|
| EP | 1677360 A2 | 7/2006 |
| WO | 2006070154 A1 | 7/2006 |

OTHER PUBLICATIONS

International Search report for PCT/US2007/025500, mailed May 6, 2008.
German Office Action for Application No. 11 2007 003 116.6 dated Jul. 20, 2010.

* cited by examiner

*Primary Examiner*—Lex Malsawma
(74) *Attorney, Agent, or Firm*—Ingrassia Fisher & Lorenz, P.C.

(57) ABSTRACT

Stress enhanced MOS transistors are provided. A semiconductor device is provided that comprises a semiconductor-on-insulator structure, a gate insulator layer, a source region, a drain region and a conductive gate overlying the gate insulator layer. The semiconductor-on-insulator structure comprises: a substrate, a semiconductor layer, and an insulating layer disposed between the substrate and the semiconductor layer. The semiconductor layer has a first surface, a second surface and a first region. The gate insulator layer overlies the first region, the conductive gate overlies the gate insulator layer, and the source region and the drain region overlie the first surface and comprise a strain-inducing epitaxial layer

25 Claims, 4 Drawing Sheets

STRESS ENHANCED TRANSISTOR

CROSS-REFERENCE TO RELATED APPLICATION

This application is a divisional of U.S. patent application Ser. No. 11/611,784, filed Dec. 15, 2006.

TECHNICAL FIELD

The present invention generally relates to transistors and to methods for their fabrication, and more particularly relates to stress enhanced transistors.

BACKGROUND

The majority of present day integrated circuits (ICs) are implemented by using a plurality of interconnected field effect transistors (FETs), also called metal oxide semiconductor field effect transistors (MOSFETs), or simply MOS transistors. A MOS transistor includes a gate electrode as a control electrode and spaced apart source and drain electrodes between which a current can flow. A control voltage applied to the gate electrode controls the flow of current through a channel between the source and drain electrodes.

The complexity of ICs and the number of devices incorporated in ICs are continually increasing. As the number of devices in an IC increases, the size of individual devices decreases. Device size in an IC is usually noted by the minimum feature size; that is, the minimum line width or the minimum spacing that is allowed by the circuit design rules. As the semiconductor industry moves to a minimum feature size of 45 nanometers (nm) and even smaller, the gain of performance due to scaling becomes limited. As new generations of integrated circuits and the transistors that are used to implement those ICs are designed, technologists must rely heavily on non-conventional elements to boost device performance The performance of a MOS transistor, as measured by its current carrying capability, is proportional to the mobility of a majority carrier in the transistor channel. By applying an appropriate longitudinal stress to the transistor channel of a MOS transistor the mobility of the majority carrier in the transistor channel can be increased. For example, applying a compressive longitudinal stress to the channel of a P-channel MOS (PMOS) transistor enhances the mobility of majority carrier holes. Similarly, applying a tensile longitudinal stress to the channel of an N-channel MOS (NMOS) transistor enhances the mobility of majority carrier electrons. The known stress engineering methods greatly enhance circuit performance by increasing device drive current without increasing device size and device capacitance.

In P-channel MOS (PMOS) transistors a longitudinal compressive stress can be created by embedding silicon germanium (eSiGe) adjacent the transistor channel to enhance the mobility of holes. To fabricate such a device a trench or recess is etched into a silicon substrate to create trenches in the silicon substrate. The trenches can then be filled using selective epitaxial growth of silicon germanium to produce embedded silicon-germanium (or "eSiGe") regions. The eSiGe regions can then eventually be used to create source/drain (S/D) areas or regions of a MOSFET device. The silicon substrate and the SiGe regions grown by the selective epitaxial process have a crystal lattice mismatch which causes intrinsic mechanical stresses in the PMOS transistor. These intrinsic mechanical stresses increase the hole mobility in the silicon channel of the PMOS transistor which can improve drive current which in turn improves performance of the PMOS transistor.

A number of difficulties are encountered in the selective epitaxial growth process needed to implement eSiGe. These include formation of epitaxial crystal defects which cause device failures, non-uniform SiGe thickness that causes variations in device parameters, intrinsic stress relaxation in SiGe that reduces device performance, high cost of the selective epitaxial processes, and complexity of integration of the selective epitaxial growth of such eSiGe regions into CMOS fabrication process.

The thickness of the eSiGe film determines the stress/stain that can be applied to the channel of the MOSFET device. As such, performance enhancements which can be realized from an embedded process are proportional to the thickness of the embedded SiGe grown in the trenches. When thinner silicon layers are used, the potential depth of trenches which can be formed in the substrate is reduced, and hence the potential thickness of the eSiGe regions is also reduced. As such, the thickness of the eSiGe that can be realized is insufficient to achieve a desired channel stress and mobility gain. For example, in conventional eSiGe processes on silicon-on-insulator (SOI), transistors are fabricated in a thin silicon layer that has a thickness between 50 nanometers (nm) to 100 nm, and the thickness of trenches which can be etched and then filled with SiGe is limited to between 40 and 60 nm. When the thickness of the eSiGe layer is limited to thicknesses within this range, the eSiGe source/drain areas are not capable of generating appropriate or suitable channel strain/stress. Moreover, when ultra-thin silicon-on-insulator (UTSOI) substrates are employed which have a silicon substrate having a thickness of 10 nm or less, it is difficult if not impossible to form trenches or recesses in the silicon substrate so that eSiGe techniques can be utilized.

In an epitaxial growth process a growing material layer substantially mimics the lattice structure of a surface upon which it is growing. Any contamination or damage of the substrate surface causes formation of the growth-in defects in epitaxial layers. The sidewalls of the trenches in silicon substrates are prone to such contamination and/or damage due to reactive ion etching (RIE) processes used. As a result, selective epitaxial regions of eSiGe often have crystal defects at the sidewalls. These defects cause stress relaxation in eSiGe and variations in device parameters.

Accordingly, it is desirable to optimize methods for fabricating stress enhanced MOS transistors. In addition, it is desirable to provide an optimized stress enhanced MOS transistor that avoids the problems attendant with conventional transistor fabrication. Furthermore, other desirable features and characteristics of the present invention will become apparent from the subsequent detailed description and the appended claims, taken in conjunction with the accompanying drawings and the foregoing technical field and background.

BRIEF SUMMARY

A semiconductor device is provided which comprises a semiconductor-on-insulator structure, a gate insulator layer, a source region, a drain region and a conductive gate overlying the gate insulator layer. The semiconductor-on-insulator structure comprises: a substrate, a semiconductor layer, and an insulating layer disposed between the substrate and the semiconductor layer. The semiconductor layer has a first surface, a second surface and a first region. The gate insulator layer overlies the first region, the conductive gate overlies the gate insulator layer, and the source region and the drain region overlie the first surface and comprise a strain-inducing epitaxial layer.

BRIEF DESCRIPTION OF THE DRAWINGS

The present invention will hereinafter be described in conjunction with the following drawing figures, wherein like numerals denote like elements, and wherein.

DETAILED DESCRIPTION

Figure 1:
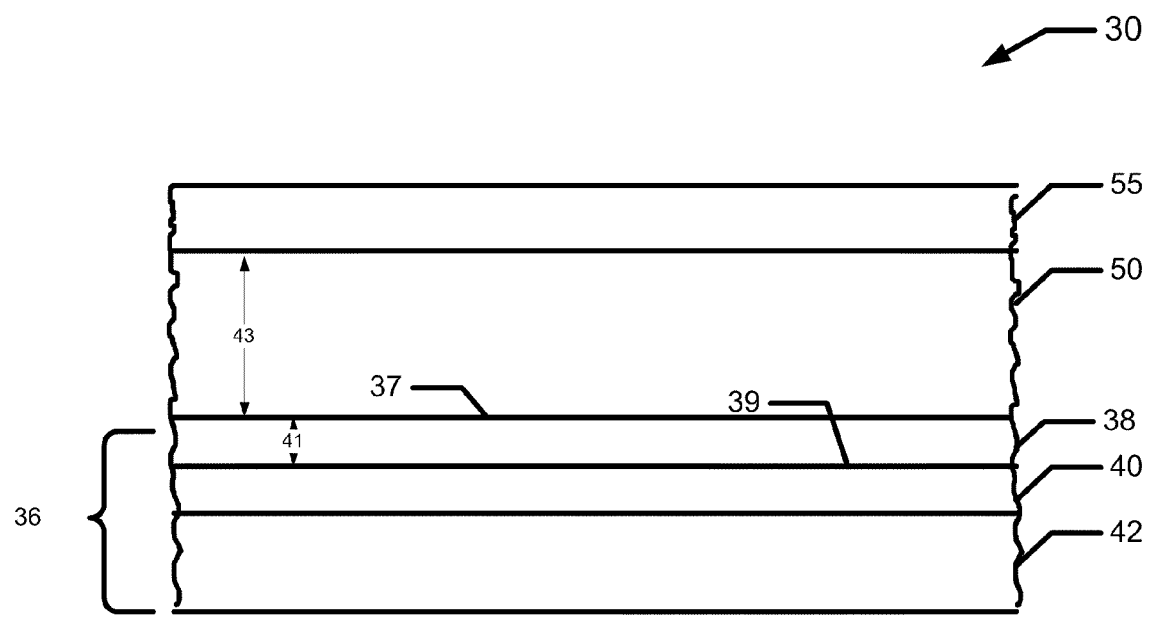
FIG. 1-7 illustrate, in cross section, a stressed MOS transistor and method steps for its fabrication in accordance with various embodiments of the invention.

The following detailed description is merely exemplary in nature and is not intended to limit the invention or the application and uses of the invention. The word "exemplary" is used herein to mean "serving as an example, instance, or illustration." Any embodiment described herein as "exemplary" is not necessarily to be construed as preferred or advantageous over other embodiments. All of the implementations described below are exemplary implementations provided to enable persons skilled in the art to make or use the invention and are not intended to limit the scope of the invention which is defined by the claims. Furthermore, there is no intention to be bound by any expressed or implied theory presented in the preceding technical field, background, brief summary or the following detailed description.

In accordance with the various embodiments of the invention a stress enhanced MOS transistor and methods for fabricating such a device are provided that optimize the channel stress and mobility gain. A semiconductor-on-insulator structure is provided which includes a semiconductor layer having a first surface. A strain-inducing epitaxial layer is blanket deposited over the first surface, and can then be used to create stress enhanced source and drain regions which overly and are "raised above" the first surface. The strain-inducing epitaxial layer is deposited non-selectively and thereby eliminates some of the problems associated with selective epitaxial growth. For example, the stress enhanced source and drain regions do not have crystal and morphological defects associated with selective epitaxy thereby improving device reliability and yield. Moreover, the manufacturing process is relatively simple and less costly in comparison to those used for eSiGe fabrication. The thickness of the strain-inducing epitaxial layer can be controlled so that the resultant MOS transistor has improved electrical performance. Because the thickness of the strain-inducing epitaxial layer is not limited by the thickness of the semiconductor layer on which it is grown, the strain-inducing epitaxial layer can provide increased channel stress and a significant enhancement in stress-induced device performance In addition, the strain-inducing epitaxial layer can be used when manufacturing MOSFETs which utilize ultra-thin semiconductor-on-insulator (UTSOI) structures, such as those with a semiconductor layer having a thickness of 10 nm or less.

FIGS. 1-7 illustrate, in cross section, a stressed MOS device 30 and method steps for fabricating such a stressed MOS device 30 in accordance with various embodiments of the invention. The resultant stressed MOS device 30 has enhanced stress source/drain areas which strain the channel 72 area of the resultant stressed MOS device 30 to increase charge carrier mobility and enhance drive current. In this illustrative embodiment the stressed MOS device 30 is illustrated as a single P-channel MOS (PMOS) transistor. It will be appreciated that the inventive concepts can also be applied in the context of NMOS fabrication technologies with appropriate change for device type as will be explained below. The described techniques may be appropriately integrated to fabricate CMOS devices. Many different integrated circuits (ICs) can be formed with stressed MOS devices, such as device 30. Such ICs can include a large number of such transistors, such as device 30, and may also include unstressed PMOS transistors and stressed and unstressed N-channel MOS (NMOS) transistors as well.

Various steps in the manufacture of MOS transistors are well known and so, in the interest of brevity, many conventional steps will only be mentioned briefly herein or will be omitted entirely without providing the well known process details. Although the term "MOS device" properly refers to a device having a metal gate electrode and an oxide gate insulator, that term will be used throughout to refer to any semiconductor device that includes a conductive gate electrode (whether metal or other conductive material) that is positioned over a gate insulator (whether oxide or other insulator) which, in turn, is positioned over a semiconductor substrate (whether silicon or other semiconductor material).

As illustrated in FIG. 1, the manufacture of a stressed MOS transistor 30 in accordance with an embodiment of the invention begins with providing a semiconductor structure 36 in and on which such transistors are fabricated. The initial steps in the fabrication of MOS transistor 30 are conventional and will not be described in detail. The semiconductor structure 36 is preferably is a semiconductor-on-insulator structure 36 which comprises at least one thin layer of semiconductor material 38 disposed on a buried oxide insulating layer 40 that, in turn, is supported by a carrier wafer 42.

The semiconductor layer 38 has a first surface 37, a second surface 39, and a first thickness 41 defined between the first surface 37 and the second surface 39. Semiconductor layer 38 will hereinafter be referred to for convenience but without limitation as a silicon substrate or a semiconductor substrate although those of skill in the semiconductor art will appreciate that the semiconductor layer 38 can be a germanium layer, a gallium arsenide layer, or other semiconductor materials. The buried oxide insulating layer 40 is disposed between the carrier wafer 42 and the second surface 39 of the semiconductor layer 38. The buried oxide insulating layer 40 can be, for example, a silicon dioxide layer, which preferably has a thickness of about 50-200 nm. In accordance with one embodiment, the first thickness 41 is between 10 nm and 30 nm.

SOI-based technologies include a thin layer of semiconductor material over an insulator layer which, in turn, overlies a carrier substrate. In accordance with one embodiment, the semiconductor structure 36 may comprise a silicon-on-insulator (SOI) structure in which the semiconductor layer 38 comprises a thin monocrystalline layer of silicon 38 on the buried oxide insulating layer 40. The thin monocrystalline layer of silicon 38 can be a silicon substrate having a (100) surface crystal orientation wherein the term "silicon substrate" encompasses relatively pure silicon materials typically used in the semiconductor industry as well as silicon admixed with small amounts of other elements such as germanium, carbon, and the like as well as impurity dopant elements such as boron, phosphorus, and arsenic. The silicon can be impurity doped either N-type or P-type, but is doped N-type in this example where a PMOS transistor 30 is being fabricated. The thin silicon layer 38 preferably has a resistivity of at least about 1-35 Ohms per square.

As illustrated in FIG. 1, a strain-inducing, epitaxial layer 50 is epitaxially grown in a "blanket" manner over the first surface 37 of the semiconductor layer 38. In general, the strain-inducing epitaxial layer 50 comprises any pseudomorphic material which can be epitaxially grown on the first surface 37 of the semiconductor layer 38. The pseudomorphic material has a different lattice constant than the lattice constant of semiconductor layer 38. During growth the pseudomorphic material repeats the lattice structure of the semiconductor layer 38 upon which it is being grown. The difference in lattice constant of the two juxtaposed materials creates a stress in the host material of semiconductor layer 38.

The term blanket growth generally means a uniform non-selective growth over the entire wafer. In the context of this invention, blanket growth will be used to refer to non-embedded epitaxial growth over either the entire P-channel areas of the wafer or over the entire N-channel areas of the wafer. Blanket growth in the context of this invention differs from selective epitaxial growth employed in embedded processes in which the embedded growth takes place in small areas such as etched trenches. When a P-channel or PMOS device is being fabricated, some areas of the wafer (e.g., which correspond to the N-channel or NMOS device) are masked so that the strain-inducing epitaxial layer 50 does not grow on those N-channel regions but only on the P-channel regions. As such, the strain-inducing epitaxial layer 50 is not "blanket" deposited overlying the N-channel regions of the device. The strain-inducing epitaxial layer 50 is deposited superjacent the first surface 37 so that the strain-inducing epitaxial layer 50 repeats the crystal structure of the first surface 37. As used herein, the term "superjacent" refers to "resting or lying immediately above or on something else," whereas the term "overlying" refers to "being placed on or over something else; or lying over or upon something else."

The strain-inducing epitaxial layer 50 is epitaxially grown in a non-selective manner on a semiconductor host. In one embodiment, blanket growing can occur using, for example, a chemical vapor deposition (CVD) process in an epitaxial reactor, which heats the wafer, and then grows the epitaxial layers by flowing a gas mixture that contains the strain-inducing material 50, and optionally a conductivity determining dopant, over the first surface 37 of the semiconductor layer 38. The non-selective epitaxial growth nucleates on the first surface 37, and the growth rate can be controlled by adjusting the growth conditions such as reactant flow, growth temperature, growth pressure, and the like during the epitaxial growth. As gaseous molecules deposit on the first surface 37, the crystalline structure of the first surface 37 of the semiconductor layer 38 is extended. Because the epitaxial growth of the strain-inducing epitaxial layer 50 is not "embedded," the epitaxial growth occurs only in one nucleating plane and is only terminated at a boundary between N-type and P-type devices. In contrast to embedded SiGe materials where eSiGe nucleates in multiple planes along the bottom of the trench and sidewalls of the trench, the strain-inducing epitaxial layer 50 nucleates along a single plane and is therefore relatively free of crystal or morphological defects which result along the sidewall portions of the embedded SiGe materials.

The strain-inducing epitaxial layer 50 material will eventually be used to create stress enhanced source and drain regions which are superjacent the first surface 37 of the semiconductor layer 38. The strain-inducing epitaxial layer 50 has a second thickness 43 greater than or equal to the first thickness 41 of the semiconductor layer 38. For example, In accordance with one embodiment, strain-inducing epitaxial layer 50 has a second thickness 43 that is between 30 nm and 100 nm. The thickness of the stress enhanced source and drain regions that are eventually fabricated from the strain-inducing epitaxial layer 50 are not limited by the thickness of the first thickness 41 of the semiconductor layer 38 of the semiconductor structure 36. As such, the strain-inducing epitaxial layer 50 can be made sufficiently thick to provide high strain in the channel 72 thereby significantly enhancing the strain-induced device performance.

Monocrystalline silicon is characterized by a lattice constant, a dimension of the silicon crystal. By substituting atoms other than silicon in a crystal lattice, the size of the resulting crystal and the lattice constant can be changed. For instance, if a larger substitutional atom such as a germanium atom is added to the silicon lattice, the lattice constant increases and the increase in lattice constant is proportional to the concentration of the substitutional atom.

In accordance with one embodiment, the strain-inducing epitaxial layer 50 can be a silicon alloy material, such as monocrystalline silicon germanium (SiGe) or a doped variation thereof. The monocrystalline silicon germanium (SiGe) can have, for example, about 10-35 atomic percent and preferably about 20-35 atomic percent germanium. Because germanium is a larger atom than silicon, the addition of germanium to the silicon creates a crystalline material having a larger lattice constant than the lattice constant of the semiconductor layer 38. Because SiGe has a greater lattice constant than semiconductor material 38, SiGe will produce a compressive longitudinal stress on the host semiconductor material 38 especially to the transistor channel 72. The compressive longitudinal stress increases the mobility of holes in the channel 72 and hence improves the performance of the P-channel MOSFET device.

In accordance with a further embodiment, the strain-inducing epitaxial layer 50 may comprise a graded layer in which the first surface 37 is grown starting with pure monocrystalline silicon 50, and then the concentration of germanium (Ge) species is increased as the strain-inducing epitaxial layer 50 grows. This produces a strain-inducing epitaxial layer 50 with a non-uniform concentration of Ge such that there is a gradient of the Ge concentration in the strain-inducing epitaxial layer 50. This helps reduce defects in the epitaxial layers 50.

In accordance with another embodiment, the strain-inducing epitaxial layer 50 can be pure germanium or one of a number of germanium-based alloys.

In accordance with another embodiment, the strain-inducing epitaxial layer 50 may comprise SiGe that is in situ doped with a conductivity determining dopant. The impurity doping elements can be added to the epitaxial growth reactants to appropriately dope the source and drain regions. For example, in one embodiment, Boron can be added to the epitaxial growth reactants during the epitaxial growth of SiGe. The impurity doped SiGe eventually form the source 51 and drains 52 regions of MOS transistor 30.

As further illustrated in FIG. 1, a protective capping layer 55 is also deposited over the strain-inducing epitaxial layer 50. The protective capping layer 55 may comprise, for example, a layer of SiO$_2$ or SiN. When the capping layer is SiN, the capping layer 55 can be deposited by LPCVD. The combined thickness of the strain-inducing epitaxial layer 50 and the protective capping layer 55 is preferably between 100 nm and 150 nm.

Figure 2:
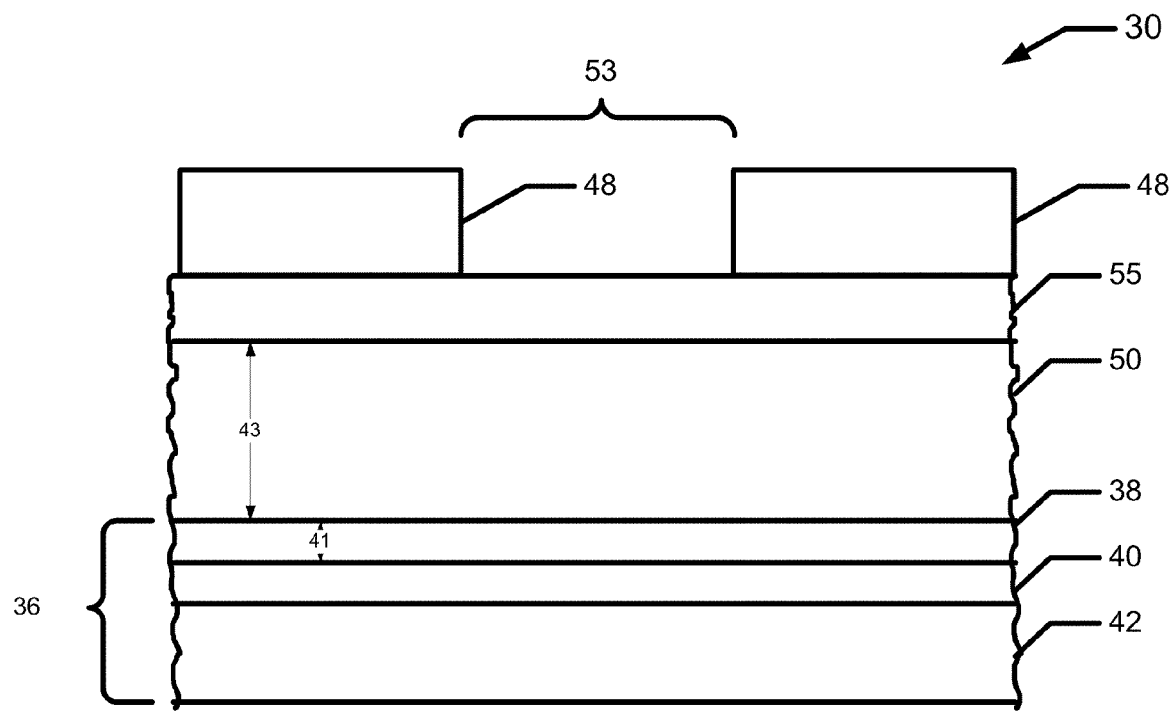

As illustrated in FIG. 2 a photoresist mask 48 can be formed over portions of the protective capping layer 55. The photoresist mask 48 comprises an opening or window 53 over a first region 49. A portion of the first region will eventually define a channel 72 of the MOS transistor 30.

Figure 3:
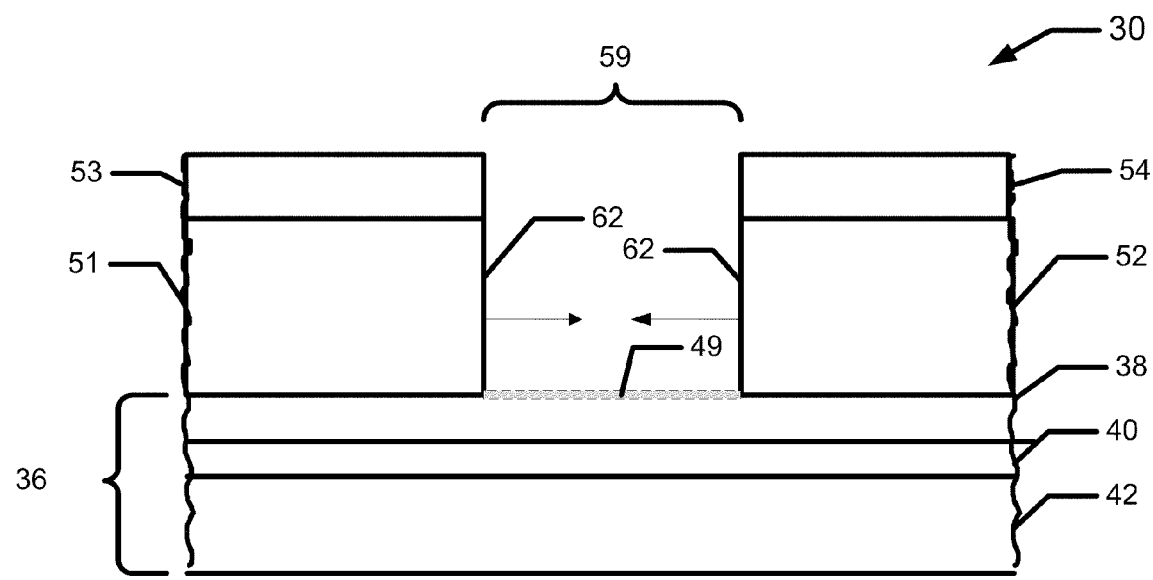

Using the photoresist mask 48 to protect covered portions of the protective capping layer 55 and the strain-inducing epitaxial layer 50, the exposed portions of the protective capping layer 55 and the strain-inducing epitaxial layer 50 can be patterned to define sidewalls 62 as illustrated in FIG. 3.

A first portion of the protective capping layer 55 and a first portion of the strain-inducing epitaxial layer 50 can then be removed (e.g., etched) to define sidewalls 62 in the protective capping layer 55 and the strain-inducing epitaxial layer 50. For instance, the protective capping layer 55 can be etched in the desired pattern by, for example, plasma etching in a $CHF_3$, $CF_4$, or $SF_6$ chemistry, and the strain-inducing epitaxial layer 50 can be etched in the desired pattern by, for example, plasma etching in a Cl or $HBr/O_2$ chemistry. As shown by the arrows, the remaining portions 51, 52 of the strain-inducing epitaxial layer 50 exert a compressive stress or strain with respect to the semiconductor layer 38.

The opening 59 between the sidewalls 62 defines an exposed portion of the first surface 37 of the semiconductor layer 38. A MOSFET channel 72 region of the stressed MOS transistor 30 will eventually be defined within the exposed portion of the first surface 37. In accordance with one embodiment, over-etching can be employed to etch away a portion 49 of the semiconductor layer 38 to adjust the thickness of the channel 72 region. In other embodiments, under-etching can be employed to stop etching before the entire strain-inducing epitaxial layer 50 is consumed such that a thin layer of the strain-inducing epitaxial layer 50 remains within the area over the first surface 37 for use as channel 72 material to improve charge carrier mobility. For example, because the mobility of both holes and electrons in SiGe is greater compared to those of silicon, the SiGe channel can provide greater charge carrier mobility and device performance.

Once the strain-inducing epitaxial layer 50 and the protective capping layer 55 are patterned, the mask 48 can be removed, for example, by plasma ashing. After etching, as illustrated in FIG. 3, the protective capping layer 55 and strain-inducing epitaxial layer 50 can be referred to as a remaining portion 51, 53 and a remaining portion 55, 54. The remaining portions 51, 52 of the strain-inducing epitaxial layer 50 exert a compressive strain along the exposed portion of the first surface 37 of the semiconductor layer 38. The compressive strain is caused due to the lattice constant mismatch between the material at the first surface 37 of the semiconductor layer 38 and material of the strain-inducing epitaxial layer 50.

Figure 4:
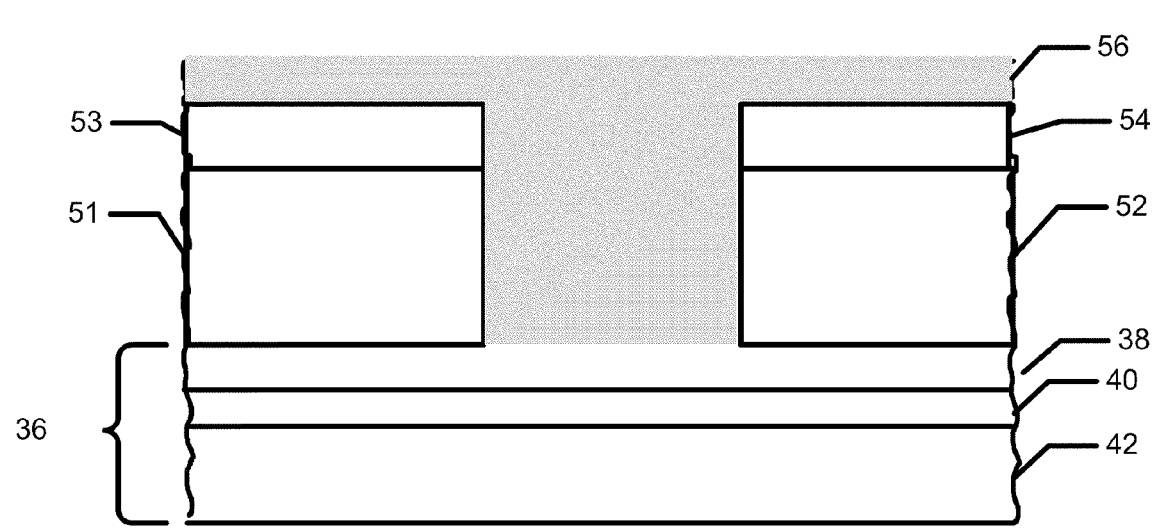

The method continues in accordance with an embodiment by deposition of an insulator layer 56 of spacer material as illustrated in FIG. 4. The insulator layer 56 can be deposited to a thickness sufficient to fill the opening 59 or corresponding to a desired width of spacers that may very for different device architectures. The insulator layer 56 can be an oxide, a nitride or a combination thereof and is preferably a thin layer of silicon dioxide (SiO2) overlaid with a layer of silicon nitride (SiN). In accordance with one embodiment, the layer of spacer forming material 56 can be doped with a suitable conductivity determining dopant (e.g., boron). As described below with reference to FIG. 7, the conductivity determining dopant can later be diffused into the first surface 37 of the semiconductor layer 38 to form source/drain extension regions.

Figure 5:
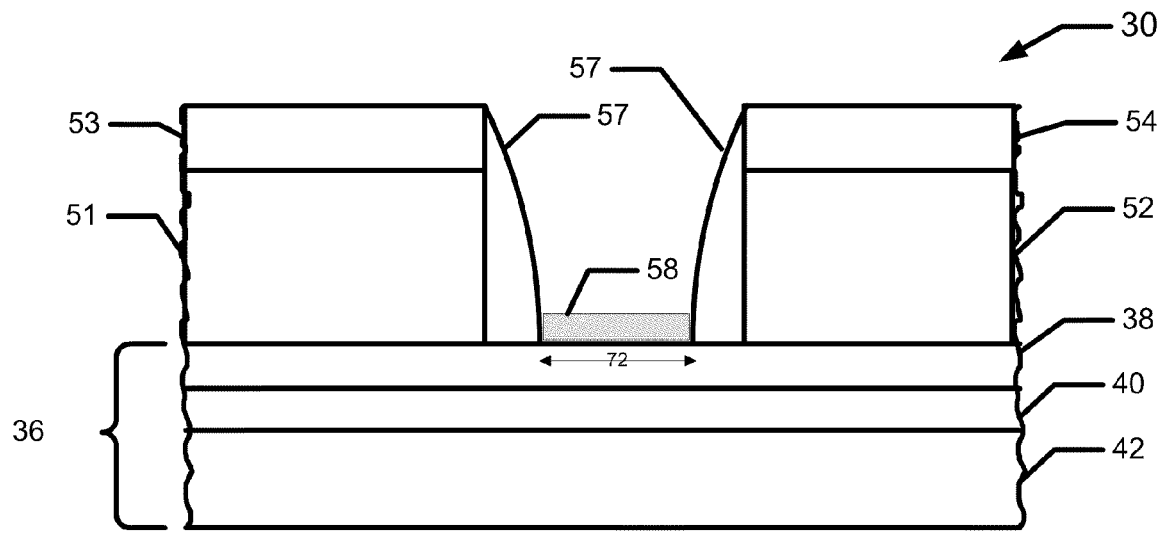

The method continues in accordance with one embodiment by anisotropic etching of the insulator layer 56 to form insulating spacers 57 as illustrated in FIG. 5. The layer of spacer forming material 56 can be anisotropically etched, for example, by plasma or reactive ion etching (RIE) using a $CF_4$ or $CHF_3$ chemistry. The insulating spacers 57 overlie the remaining portions of the protective capping layer 55, the strain-inducing epitaxial layer 50, portions of the exposed surface of the semiconductor layer 38 and the opposing sidewalls 55. Although not shown in FIG. 5, a remaining exposed portion of the initial exposed portion of the first surface 37 is defined over a first region of the semiconductor-on-insulator structure 36, and preferably has a width or longitudinal dimension that is between 20 nm and 50 nm.

Remaining exposed portions are cleaned and a gate insulator layer 58 is formed over the remaining exposed portion of the first surface 37 of semiconductor layer 38. The remaining exposed portion of the first surface 37 forms the channel 72 of the stressed MOS device 30, and the insulator layer 58 will eventually serve as a gate insulator layer as illustrated in FIG. 5. The gate insulator layer 58 generally has a thickness that is between 1 nm and 10 nm and is preferably about 1-2 nm thick. The insulating spacers 57 space the insulator layer 58 apart from the eventual source and drain regions 51, 52 of the stressed MOS device 30.

For example, in one embodiment, the insulator layer 58 can be formed by using atomic layer deposition to deposit a layer of dielectric material which has a high dielectric constant (κ). The atomic layer deposition techniques used to deposit the high-κ dielectric material include, for example, by chemical vapor deposition (CVD), low pressure chemical vapor deposition (LPCVD), semi-atmospheric chemical vapor deposition (SACVD), or plasma enhanced chemical vapor deposition (PECVD). The high-κ dielectric material are materials with a dielectric constant greater than 3.9 and may comprise, for example, hafnium or zirconium silicates, and hafnium or zirconium oxides.

Alternatively, in another embodiment, the insulator layer 58 can be formed by growing a layer of silicon dioxide. For example, the insulator layer 58 may be thermally grown silicon dioxide formed by heating the silicon substrate in an oxidizing ambient so that a thermally grown silicon dioxide layer grows only on the exposed portion of the first surface 37 of the semiconductor layer 38.

Figure 6:
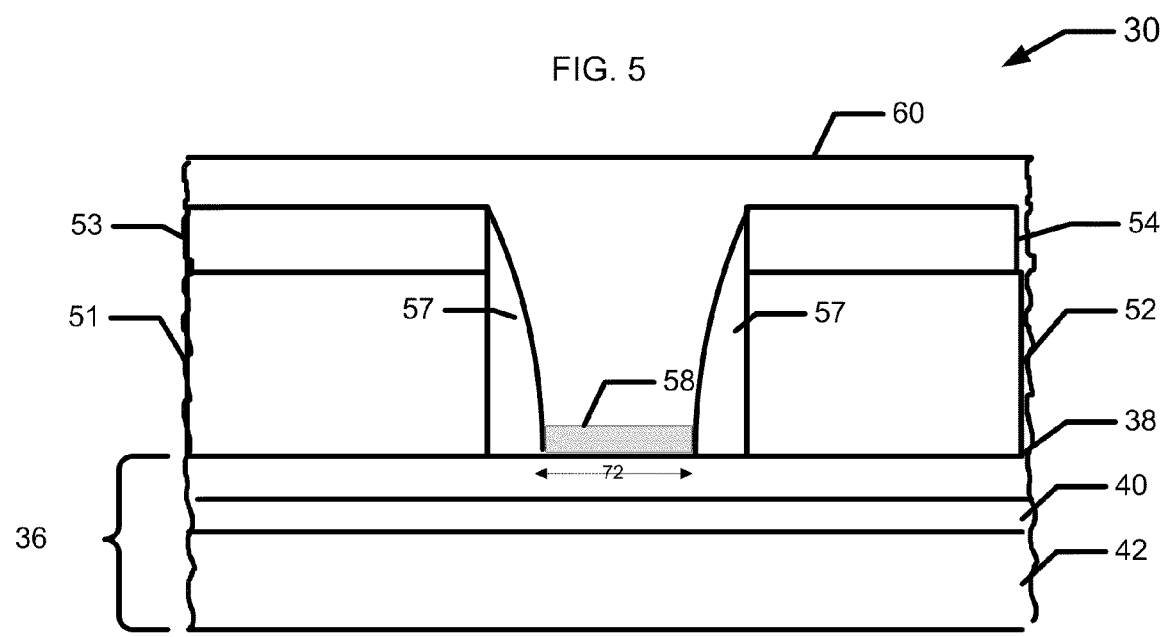

As illustrated in FIG. 6, a layer of gate electrode forming material 60 (or "conductive gate material") can be deposited over the remaining portions 53, 54 of the protective capping layer 55, the insulating spacers 57 and the gate insulator layer 58.

The conductive gate material 60 can be, for example, polycrystalline silicon deposited onto the layer of gate insulator 58, for example, via LPCVD by the hydrogen reduction of silane ($SiH_4$). The layer of polycrystalline silicon is preferably deposited as undoped polycrystalline silicon and can be subsequently impurity doped by ion implantation. The polycrystalline silicon layer can be deposited to a thickness of about 50-200 nm and preferably to a thickness of about 100 nm. Alternatively, where the layer of gate insulator 58 and conductive gate material 60 comprise a "high k metal gate structure," the conductive gate material 60 can be metal gate electrode forming materials such as iridium (Ir), rhenium (Re), titanium (Ti), titanium nitride (TiN) and their alloys, and a polysilicon interface on top of the metal as a contact material. The metal layer can be deposited by itself or with appropriate impurity doping to set the necessary threshold voltage of the transistor.

Figure 7:
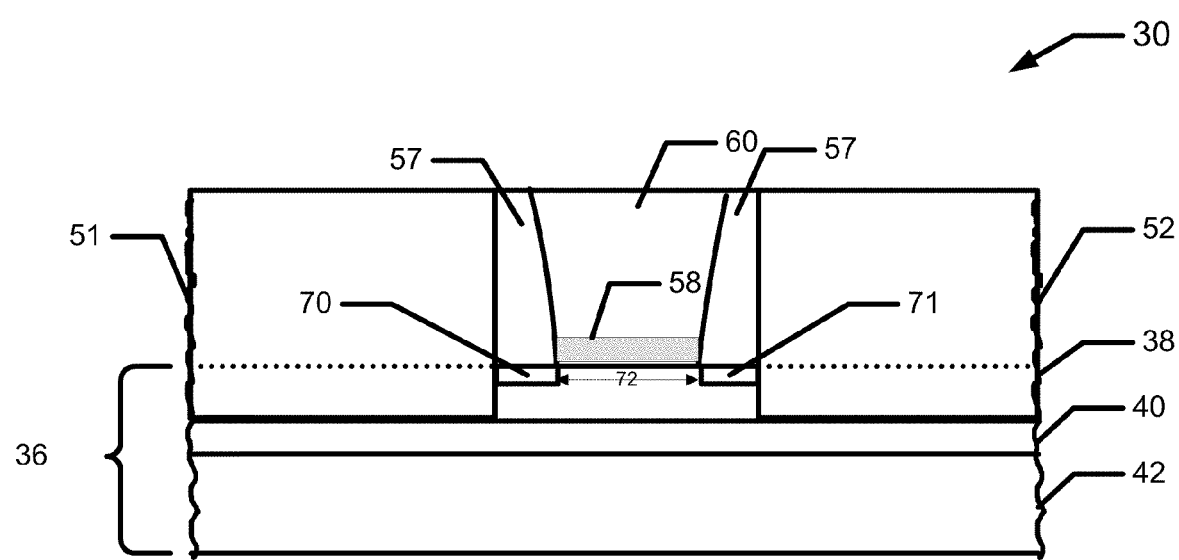

Portions of the conductive gate electrode layer 60, which overlie remaining portions 51, 52 of the strain-inducing epitaxial layer 50 can be removed to expose the source/drain regions 51, 52 as illustrated in FIG. 7. In accordance with one embodiment, the top portions of the remaining portions 51, 52 of the strain-inducing epitaxial layer 50 as well as the top portions of the insulating spacers 57 can also be removed to ensure that there is adequate separation between the gate electrode 60 and the source/drain regions 51, 52. The insulating spacers 57 have an initial height that is between 100 nm and 150 nm, however, the final height of the insulating spacers 57 can be reduced to between 30 nm and 60 nm. For example, in one embodiment, a chemical mechanical planarization (CMP) process can be used to remove portions of the conductive layer which overlie the remaining portions 51, 52 of the strain-inducing epitaxial layer 50, and to remove the remaining portions 53, 54 of the protective capping layer 55. Following CMP processing, as illustrated in FIG. 7, the remaining portions 51, 52 of the strain-inducing epitaxial layer 50 comprise the source 51 and drain 52 of the stressed MOS transistor 30, and the gate electrode 60. The gate electrode 60 defines the channel 72 region as that portion at the surface of thin silicon layer 38 underlying the gate electrode. Preferably the channel 72 is oriented along a [110] crystal direction so that current flow in the transistor will be in the [110] crystal direction. A [100] crystal direction may be preferred for NMOS in some architectures.

As also illustrated in the exemplary embodiment of FIG. 7, source/drain regions 51, 52 can be extended below the first surface of the semiconductor layer 38, which is illustrated with a dashed line, by out diffusing a conductivity determining dopant from the remaining portions of the strain-inducing epitaxial layer 50. The diffusion can be caused by a thermal anneal, preferably a rapid thermal anneal (RTA). It will be appreciated that all of the diffusion does not necessarily take place solely in FIG. 7, but can instead take place at various heating steps which occur as the stressed MOS transistor 30 is being fabricated. In a further embodiment illustrated in FIG. 7, a conductivity determining dopant can also be diffused from the insulating spacers 57 to form source/drain extension regions 70, 71 under the insulating spacers 57. Once diffusion is complete, the source/drain extension regions 70, 71 can have a thickness between 5 nm and the thickness of the channel 72.

Although not illustrated, the stress enhanced MOS transistor 30 illustrated in FIG. 7 can be completed in conventional manner Conventional steps include, for example, forming metal silicide contacts on the source and drain regions, depositing interlayer dielectric layers, planarizing the interlayer dielectric layers, and etching contact vias or openings through the dielectric layer to the metal silicide contacts. For instance, a layer of silicide forming metal is deposited or formed over the remaining exposed portions of the strain-inducing epitaxial layer 50, and heated to cause the metal to react with exposed portions of the strain-inducing epitaxial layer 50 and the remaining portions 51, 52 of the strain-inducing epitaxial layer 50 to form a metal silicide. Electrical contact to the metal silicide layers (and hence the source 51 and drain 52 regions) and the gate electrode 60 can then be made by contact plugs formed in contact openings and by interconnect metal deposition and patterning.

The foregoing embodiments have been of methods for fabricating stress enhanced PMOS transistors. Similar NMOS fabrication technologies can be used to fabricate stress enhanced NMOS transistors, and the fabrication of either structure or both structures can be integrated into methods for fabricating CMOS integrated circuits including both stressed and unstressed PMOS and NMOS transistors.

The fabrication of a stress enhanced NMOS transistor is similar to the methods described above except that the semiconductor layer 38 is impurity doped P-type, the source and drain regions are impurity doped with N-type conductivity determining ions. Moreover, the strain-inducing material 50 should have a smaller substitutional atom such that the grown strain-inducing material 50 has a lattice constant that is smaller than the lattice constant of the host material. Adding a smaller substitutional atom to the strain-inducing material 50, causes lattice constant mismatch between the material at the first surface 37 of the semiconductor layer 38 and material of the strain-inducing epitaxial layer 50. This creates a longitudinal tensional stress or strain on the host lattice.

For instance, in one exemplary embodiment of an N-channel MOSFET device, the strain-inducing epitaxial layer 50 can be, for example, a monocrystalline material such as silicon carbon (Si:C). The Si:C can include up to about 15% carbon and preferably includes about 2-7% carbon. Silicon carbon (Si:C) has a smaller lattice constant than the lattice constant of the semiconductor layer 38. Because carbon is a smaller atom than that of silicon, the addition of carbon to silicon creates a crystalline material having a smaller lattice constant than that of the semiconductor layer 38. The remaining portions 51, 52 of the strain-inducing epitaxial layer 50, which are used as the source and drain regions 51, 52, exert a tensile strain (e.g., a tensile longitudinal stress) along the exposed portion of the first surface 37 of the semiconductor layer 38. The tensile longitudinal stress applied to the transistor channel 72 increases the mobility of majority carrier electrons in the transistor channel 72 of an NMOS transistor and hence improves the performance of the N-channel MOSFET device.

In other embodiments, the Si:C can be in situ doped with a conductivity determining dopant such as arsenic or phosphorus. The impurity doping elements can be added to the epitaxial growth reactants to appropriately dope the source and drain regions. For example, arsenic or phosphorus can be added to the epitaxial growth reactants during the epitaxial growth of Si:C. The impurity doped Si:C eventually form the source 51 and drains 52 regions of MOS transistor 30.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:

1. A semiconductor device, comprising:
 a semiconductor-on-insulator structure comprising: a substrate, a semiconductor layer having, a first surface, a second surface, and a first region, and an insulating layer disposed between the substrate and the second surface of the semiconductor layer;
 a gate insulator layer overlying the first region;
 a source region overlying the first surface, wherein the source region comprises a strain-inducing epitaxial layer superjacent the first surface that extends a crystalline structure of the semiconductor layer and induces strain in the semiconductor layer;
 a drain region overlying the first surface, wherein the drain region comprises the strain-inducing epitaxial layer; and
 a conductive gate electrode overlying the gate insulator layer.

2. A semiconductor device according to claim 1, wherein the strain-inducing epitaxial layer comprises:
 a silicon germanium layer doped with a conductivity determining dopant.

3. A semiconductor device according to claim 1, wherein the strain-inducing epitaxial layer comprises:
 a silicon carbon layer doped with a conductivity determining dopant.

4. A semiconductor device according to claim 1, wherein the semiconductor layer has a first thickness, and wherein the strain-inducing epitaxial layer has a second thickness greater than or equal to the first thickness.

5. A semiconductor device according to claim 4, wherein the conductive gate electrode comprises an upper surface that is co-planar with the first surface of the strain-inducing epitaxial layer.

6. A semiconductor device according to claim 1, wherein source region and the drain region consist of the strain-inducing epitaxial layer.

7. A semiconductor device, comprising:
a semiconductor-on-insulator structure comprising: a substrate, a semiconductor layer having, a first surface and a second surface, and an insulating layer disposed between the substrate and the second surface of the semiconductor layer;
a strain-inducing epitaxial layer superjacent the first surface that extends a crystalline structure of the semiconductor layer and induces strain in the semiconductor layer, the strain-inducing epitaxial layer having sidewalls defined in the strain-inducing epitaxial layer that extend to the semiconductor layer;
insulating spacers overlying the sidewalls, wherein the insulating spacers define a space between the insulating spacers that exposes a portion of the first surface; and
source/drain extension regions that extend under the insulating spacers, wherein the source/drain extension regions are in contact with portions of the strain-inducing epitaxial layer.

8. A semiconductor device according to claim 7, wherein the strain-inducing epitaxial layer is a non-embedded strain-inducing epitaxial layer.

9. A semiconductor device according to claim 7, wherein the strain-inducing epitaxial layer comprises a silicon germanium layer over the first surface.

10. A semiconductor device according to claim 9, wherein the silicon germanium layer is doped with a conductivity determining dopant.

11. A semiconductor device according to claim 7, wherein the strain-inducing epitaxial layer comprises a silicon carbon layer over the first surface.

12. A semiconductor device according to claim 11, wherein the silicon carbon layer is doped with a conductivity determining dopant.

13. A semiconductor device according to claim 7, further comprising:
a gate insulator layer over the exposed portion of the first surface; and
a conductive gate electrode overlying the insulating spacers and the gate insulator layer, wherein the conductive gate electrode fills a space between the insulating spacers, wherein the conductive gate electrode comprises an upper surface that is co-planar with the first surface of the strain-inducing epitaxial layer.

14. A semiconductor device according to claim 7, wherein the strain-inducing epitaxial layer and the insulating spacers are in situ doped with a dopant, and wherein the source/drain extension regions comprise diffusion regions of the dopant under the insulating spacers.

15. A semiconductor device according to claim 7, wherein the semiconductor layer has a first thickness, and wherein the strain-inducing epitaxial layer has a second thickness greater than or equal to the first thickness.

16. A semiconductor device according to claim 7, wherein the semiconductor layer has a first thickness, and wherein the strain-inducing epitaxial layer has a second thickness greater than or equal to the first thickness.

17. A semiconductor device, comprising:
a semiconductor-on-insulator structure comprising: a substrate, a semiconductor layer having a first surface and a second surface, and an insulating layer disposed between the substrate and the second surface of the semiconductor layer, wherein the semiconductor layer has a first thickness;
a source region and a drain region superjacent the first surface, wherein the source region and the drain region are formed in a strain-inducing epitaxial material superjacent the first surface that extends a crystalline structure of the semiconductor layer and induces strain in the semiconductor layer, wherein the source region and the drain region each have a substantially vertical sidewall, and wherein the source region and the drain region each have the second thickness greater than or equal to the first thickness and induce strain in the semiconductor layer;
insulating spacers overlying the substantially vertical sidewalls, wherein the insulating spacers define a space between the insulating spacers that exposes a portion of the first surface;
a gate dielectric layer defined between the insulating spacers over the exposed portion of the first surface; and
a conductive gate electrode overlying portions of the insulating spacers and the gate dielectric layer, wherein the conductive gate electrode fills a space between the insulating spacers.

18. A semiconductor device according to claim 17, wherein the strain-inducing epitaxial material comprises a silicon germanium layer that is doped with a conductivity determining dopant.

19. A semiconductor device according to claim 17, wherein the strain-inducing epitaxial material comprises a silicon carbon layer that is doped with a conductivity determining dopant.

20. A semiconductor device according to claim 17, further comprising:
source/drain extension regions formed under the insulating spacers.

21. A semiconductor device according to claim 17, wherein the strain-inducing epitaxial material is lattice mismatched with the semiconductor layer.

22. A semiconductor device according to claim 17, wherein the insulating spacers contact a portion of the semiconductor layer.

23. A semiconductor device according to claim 17, wherein the conductive gate electrode is spaced apart from the source region and the drain region by the insulating spacers, wherein the conductive gate electrode comprises an upper surface that is co-planar with the first surface of the strain-inducing epitaxial layer.

24. A semiconductor device according to claim 17, wherein the source region and the drain region extend below the first surface to the insulating layer.

25. A semiconductor device according to claim 17, wherein the semiconductor layer has a first thickness, and wherein the strain-inducing epitaxial layer has a second thickness greater than or equal to the first thickness.

* * * * *